(12) United States Patent
Melanson et al.

(10) Patent No.: US 9,335,429 B2
(45) Date of Patent: May 10, 2016

(54) LOW POWER ANALOG-TO-DIGITAL CONVERTER FOR SENSING GEOPHONE SIGNALS

(71) Applicant: Cirrus Logic, Inc., Austin, TX (US)

(72) Inventors: John L. Melanson, Austin, TX (US); Rahul Singh, Austin, TX (US); Prashanth Drakshapalli, Austin, TX (US); Dale Brummel, Spicewood, TX (US); Stephen T. Hodapp, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 14/636,417

(22) Filed: Mar. 3, 2015

(65) Prior Publication Data

US 2015/0171889 A1 Jun. 18, 2015

Related U.S. Application Data

(63) Continuation-in-part of application No. 13/799,323, filed on Mar. 13, 2013, now Pat. No. 8,970,413.

(60) Provisional application No. 62/025,225, filed on Jul. 16, 2014, provisional application No. 62/044,148, filed on Aug. 29, 2014, provisional application No. 61/705,520, filed on Sep. 25, 2012.

(51) Int. Cl.
*H03M 3/00* (2006.01)
*G01V 1/18* (2006.01)

(52) U.S. Cl.
CPC .............. *G01V 1/181* (2013.01); *H03M 3/424* (2013.01); *H03M 3/45* (2013.01); *H03M 3/454* (2013.01)

(58) Field of Classification Search
CPC ....... H03M 3/424; H03M 3/45; H03M 3/454; G01V 1/181
USPC .................................................. 341/143, 155
See application file for complete search history.

(56) References Cited

U.S. PATENT DOCUMENTS

| 3,685,047 | A | | 8/1972 | Sherer | |
|---|---|---|---|---|---|
| 4,415,979 | A | * | 11/1983 | Hernandez | G08B 13/00 340/429 |
| 4,706,226 | A | | 11/1987 | Houghtaling | |
| 5,172,345 | A | | 12/1992 | van der Poel | |
| 5,896,101 | A | | 4/1999 | Melanson | |
| 6,101,864 | A | | 8/2000 | Abrams et al. | |
| 6,356,085 | B1 | * | 3/2002 | Ryat | G01N 27/228 324/607 |
| 6,806,756 | B1 | * | 10/2004 | Manlove | H03F 3/45973 327/307 |

(Continued)

OTHER PUBLICATIONS

Badger, A.S., Beercroft, A. Stienstra, Seismic Data Recording: The Limiting Component, 1990 SEG Annual Meeting, Sep. 23-27, 1990, San Francisco, California.

*Primary Examiner* — Khai M Nguyen
(74) *Attorney, Agent, or Firm* — Jackson Walker L.L.P.

(57) ABSTRACT

A low power analog-to-digital converter configured to sense sensor signals may include a loop filter and a feedback digital-to-analog converter. The loop filter may have a loop filter input configured to receive an input current signal from a sensor and generate an output signal responsive to the input current signal. The feedback digital-to-analog converter may have a feedback output configured to generate a current-mode or charge-mode feedback output signal responsive to the output signal, the feedback output coupled to the loop filter input in order to combine the input current signal and the feedback output signal at the input.

22 Claims, 9 Drawing Sheets

(56) References Cited

U.S. PATENT DOCUMENTS 7,230,555 B2 6/2007 Dolazza et al.
7,518,954 B2 4/2009 Hagedoorn
2004/0252585 A1 12/2004 Smith
2013/0194117 A1 8/2013 Goulier et al.

* cited by examiner

LOW POWER ANALOG-TO-DIGITAL CONVERTER FOR SENSING GEOPHONE SIGNALS

CROSS-REFERENCE TO RELATED APPLICATIONS

The present application claims priority from U.S. Provisional Patent Application No. 62/025,225 filed on Jul. 16, 2014, claims priority from U.S. Provisional Patent Application No. 62/044,148 filed on Aug. 29, 2014, and is a continuation-in-part ("CIP") application of U.S. Non-Provisional application Ser. No. 13/799,323 filed on Mar. 13, 2013 which claims priority from U.S. Provisional Patent Application No. 61/705,520 filed on Sep. 25, 2012, all of which are incorporated herein by reference.

FIELD OF THE INVENTION

The field of representative embodiments of this disclosure relates to methods, apparatuses, or implementations concerning low-power, high-resolution Analog-to-Digital Converters (ADCs). Applications include, but are not limited to, those concerning geophones and geophone signals.

BACKGROUND

A geophone is a device for converting ground movement (displacement) into an electrical signal, which may be recorded at a recording station. The deviation of this measured signal from the base line is called the seismic response and is analyzed to determine structure of the earth. Geophones are used by seismologists to study the earth and are also used in oil and gas exploration to map underground structures and locate oil and gas deposits.

Geophones may also be used for other purposes, including alarm systems and military applications, where ground motion may detect movement of people or vehicles. In addition, geophones have a very broad market in data acquisition technology. The accelerometers used in earth movement monitoring are large 0 to 10 Hz geophones and are distributed all over the globe in autonomous-nodal stations to study and forewarn of disastrous earth movements. Smaller versions are required in buildings in areas like Japan to study the infrastructure when earthquakes and aftershocks occur. There are many placed per floor and permanently deployed. Large machinery like turbines may require geophones to monitor the bearings, armatures, and the like for cracks/wear and for proactive maintenance.

Geophones have historically been analog devices and originally comprised a spring-mounted magnetic mass moving within a wire coil to generate an electrical signal. In more recent times, geophones have utilized a wire coil connected to a spring or springs, which allow the coil to move over a stationary magnet. Geophones are based on an inertial mass (proof mass) suspended from a spring. They function much like a microphone or loudspeaker, with a magnet surrounded by a coil of wire. In modern geophones, the magnet is fixed to the geophone case, and the coil represents the proof mass.

The frequency response of a geophone is that of a damped sinusoid, mainly determined by corner frequency (typically around 10 Hz) and damping (typically 0.707). Because the corner frequency is proportional to the inverse root of the moving mass, geophones with low corner frequencies (<1 Hz) become impractical. It is possible to lower the corner frequency electronically at the price of higher noise and cost.

Traditionally, geophones have been passive analog devices, outputting a low-voltage, (e.g., substantially 3 V) low-current (e.g., substantially 3.3 mA or less) analog signal, which requires amplification as well as conversion into digital form using an analog-to-digital converter (ADC). Traditional geophone sensors measured voltage at the geophone, rather than current. As the signal is a very low power signal, it may tend to be noisy and difficult to measure, as the sensor needs to detect small variations in voltage. In a traditional ADC solution, an amplifier amplifies the output voltage of the geophone. The amplified output is then digitized by a high-resolution ADC. The amplifier is needed to sense the geophone signals, as the signals are weak and noisy. A parallel resistor may provide for a known load. However, such amplifiers may require additional power, which may not be available, particularly for battery-operated and remote installations.

U.S. Patent Publication No. 2004/0252585 to Smith dated Dec. 16, 2004 (hereafter referred to as "Smith") and incorporated herein by reference, discloses the benefits of a digital geophone system. Smith notes that one problem associated with traditional geophone systems is noise immunity. For longer distances, the geophone signal must be amplified and re-transmitted. This concatenation of cable and amplifiers adds system noise to the original seismic signal, thus decreasing the overall signal to noise ratio of the geophone. Smith attempts to overcome these problems by using a digital geophone. However, one problem with this approach is the power required to support the proposed digital geophone of Smith.

U.S. Pat. No. 7,518,954 to Hagedoorn issued Apr. 14, 2009 (hereafter referred to as "Hagedoorn") and incorporated herein by reference, discloses a geophone with an internal cavity that houses an electronic circuit, mainly to accommodate an amplifier plus other electronics. As illustrated in the figures of Hagedoorn, it can be seen that the geophone transducers were mainly used in machine health type application. In some of these applications, a power cable is required to supply the electronics, but it is not the ideal situation. To mount a transducer on a rotating armature makes it hard to connect a wire, so in other applications, a battery (and some means to recharge) is applied. For battery-powered geophone applications, lower power consumption is desirable.

The limitations of the moving coil geophone recording system are largely in the data acquisition electronics and traditionally, the acceleration signal created by a geophone is converted to a voltage. Measuring voltage was beneficial when building an array of geophones in order to cancel the ground roll and to sum (amplify) reflected source signals.

A publication entitled "Seismic data recording: the limiting component" by A. S. Badger, A. D. Beecroft, A. Stienstra, SEG conference (1990), and incorporated herein by reference, disclosed that the geophone dynamic range is limited at one end by physics (Brownian motion) and by mechanics at the other (the spring may add a large horizontal signal which distorts the overall signal). Therefore, the dynamic range of a moving coil device without a damping resistor is ~140 dB. When used in the voltage mode, the damping resistor is typically in the range of 1,000-10,000 ohms.

Also, the geophone collects data from its resonant frequency to the point where mechanical limitations start to set in. Therefore, by removing a damping resistor, the benefits may be twofold. One benefit is that it may eliminate certain thermal (Johnson) noise, and another benefit is that it may control the resonant frequency via the feedback current. This control allows the moving coil sensor to lower the bandwidth to 1-2 Hz, which expands the recordable bandwidth and obtains the sub-10 Hz signal that the oil exploration industry may be interested in. It is believed that Schlumberger, among others, have implemented the moving coil geophone accelerometer and have proven its benefits. One problem with these systems, however, involves acquiring data at ultra-low power while maintaining the fidelity of the sensor. By controlling the resonant frequency, one may be able to record down to 1-2 Hz, and one can increase the spring tension to build a 28 Hz geophone, increasing the fidelity at higher frequency and allowing the geophone to be put, for example, in a shear wave topology.

Electrical current produced by a moving coil geophone is very small (e.g., substantially 3.3 mA or less) and thus needs to be amplified in traditional data acquisition circuits. In traditional data acquisition circuits, a programmable gain amplifier is used typically to amplify the geophone signals. The programmable gain amplifier demands power from the power supply, which in a geophone installation could be a battery or a long cable. It would be desirable to eliminate the programmable gain amplifier from a geophone instrumentation design in order to reduce power consumption. It would also be desirable to address one or more other shortcomings referenced here, each of which is by way of example only.

SUMMARY

In accordance with the teachings of the present disclosure, one or more disadvantages and problems associated with existing approaches to converting low-power analog signals into digital signals may be reduced or eliminated.

In accordance with embodiments of the present disclosure, a low power analog-to-digital converter configured to sense sensor signals may include a loop filter and a feedback digital-to-analog converter. The loop filter may have a loop filter input configured to receive an input current signal from a sensor and generate an output signal responsive to the input current signal. The feedback digital-to-analog converter may have a feedback output configured to generate a current-mode or charge-mode feedback output signal responsive to the output signal, the feedback output coupled to the loop filter input in order to combine the input current signal and the feedback output signal at the input.

In accordance with these and other embodiments of the present disclosure, a method for sensing sensor signals may include receiving an input current signal from a sensor in a loop filter having a loop filter input. The method may also include generating an output signal responsive to the input current signal by the loop filter. The method may additionally include generating one of a current-mode feedback output signal or a charge-mode feedback output signal responsive to the output signal. The method may further include combining the input current signal and the feedback output signal at the loop filter input.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

DETAILED DESCRIPTION

In reference to FIGS. 1A-8, at least the following steps may be performed in conjunction with methods or implementations according to different embodiments of the present disclosure. Additionally, or alternatively, steps such as those listed below may be incorporated into corresponding apparatuses or systems according to other embodiments of this disclosure.

Figure 1A:
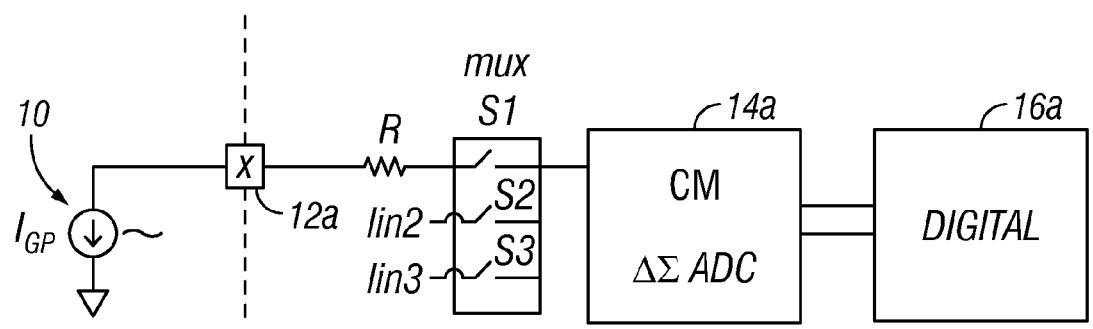
FIG. 1A is a circuit block diagram of a first example embodiment geophone system having a single-ended input and a low-power analog-to-digital converter, in accordance with embodiments of the present disclosure.

FIG. 1A is a circuit block diagram of a first embodiment geophone system having a single-ended input and a low-power analog-to-digital converter, such as current-mode delta-sigma modulator analog-to-digital converter (CM ΔΣ ADC) 14a. In the embodiment of FIG. 1A, resistance from resistor R may be provided in line into a multiplexer (mux). Resistor R may be split internally and externally to the current-mode delta-sigma analog-to-digital converter 14a, and thus may represent the combination of internal and external resistances. For all of the embodiments described herein, the series resistor R may represent any combination of resistances, internal and external to the integrated circuit that would embody CM ΔΣ ADC 14a as would be understood by those of ordinary skill in the art. For example, resistance R may represent a combination of an internal resistance of 100 ohms and an external resistance of 900 ohms in one application. In another application, no external resistance may be present, thus providing different overall impedance. In general, it is desirable to keep the resistance low, as less thermal noise is added, and the over-damped geophone has less mechanical motion, thereby producing lower distortion. In the preferred embodiment, the preferred total input impedance is on the order of 50 ohms per input.

One purpose for using a mux in a seismic recording system is to disconnect the sensor so the data acquisition system and the sensor can be tested. Some sensor manufacturers have experimented with testing the sensor and the signal processing hardware (e.g., amplifier, analog-to-digital converter, signal filter, and the like) all at the same time. However, providing a mux in the design may provide the user with both options—testing the sensor by itself, or in conjunction with the signal processing hardware. Using a mux for multiple sensors may not be as feasible for seismic exploration but may be useful for monitoring machine health, or other applications. Embodiments of low-power analog-to-digital converters may integrate the ADC with the sensor, thus creating a "smart sensor" that operates using low power while still maintaining and verifying required dynamic range (low noise and distortion) for most common applications. The mux may or may not be included, depending on the application.

Referring to FIG. 1A, a geophone sensor, transducer, or other low-power output instrument or sensor is shown or represented as element 10, outputting a time-varying current signal in response to mechanical vibrations or movement, such as movements of the earth. The term "low-power" as used in the present application, refers to instruments and components outputting low-power signals and/or having low-power usage requirements, on the order of 10 mW or less. In a geophone application, the output signal from the geophone may be a low-voltage, low-power signal. In addition, because such instruments may be remotely located or battery powered, they may have lower power consumption requirements as well. However, it should be understood that the present invention may be applied to other types of instruments where energy savings or other features of the invention as described herein are advantageous.

Current output $I_{GP}$ of the geophone device may be measured at output terminal 12a, which may be a terminal present on sensor packaging or wire leads from a sensor or the like. Another terminal of the geophone or other low-power output instrument or sensor 10 may be grounded. The dashed line in FIGS. 1A, 1B may represent a boundary between geophone or other low-power output instrument or sensor 10 and an integrated circuit housing a low-power analog-to-digital converter, in the one embodiment. In some embodiments, the elements of the low-power analog-to-digital converter may be provided as discrete components or the package may be integrated into a geophone or other instrumentation device. Other arrangements or configurations may also be apparent to one of ordinary skill in the art having the benefit of the present disclosure.

Current-mode delta-sigma analog-to-digital converter 14a may measure the current output $I_{GP}$ produced by the geophone or other instrument and then may output a digital signal. This digital signal, which may be representative of earth vibrations or movement, or other signal types, may then be communicated to a digital circuit 16a for data logging, analysis, alarm functions, and/or other uses commonly known for such geophone or other sensor data.

Traditional geophone sensors measure voltage at the geophone, rather than current. As the signal is a very low-power signal, it may tend to be noisy and difficult to measure, as the sensor needs to detect small variations in voltage. Output terminal 12a of geophone or other low-power output instrument or sensor 10 may be coupled in line to resistor R, the mux, and the current-mode delta-sigma analog-to-digital converter 14a. Current-mode delta-sigma analog-to-digital converter 14a may have either a current-mode or a charge-mode feedback. As the sample rate is constant, charge mode is an implementation of current-mode feedback, as I=Q*Fs, where I is current, Q is charge, and Fs is a sample rate. The value for the resistor R may be selected in such a way so that the transducer or geophone sensor may be designed to experience constant or substantially constant (e.g., within measurable limits) low impedance, as practically possible.

Figure 1B:
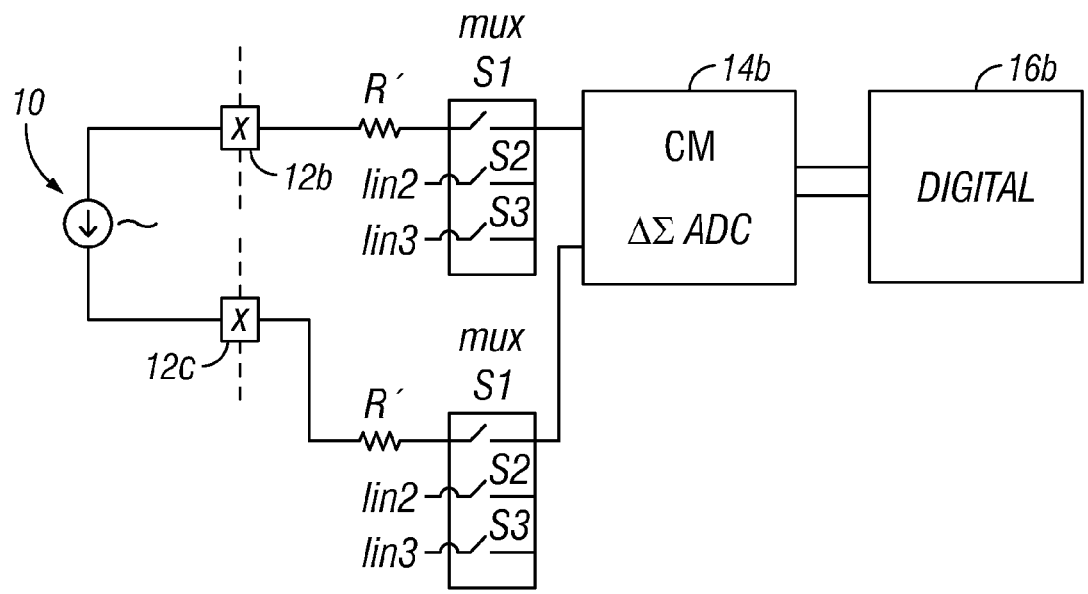
FIG. 1B is a circuit block diagram of a second example embodiment geophone system having differential-ended inputs and a low-power analog-to-digital converter, in accordance with embodiments of the present disclosure.

FIG. 1B is a circuit block diagram of a second embodiment geophone system having differential-ended inputs and a low-power analog-to-digital converter. The second embodiment geophone system of FIG. 1B may be similar to the first embodiment geophone system of FIG. 1A, so only differences will be discussed. The main difference is that the second embodiment geophone system has differential-ended inputs while the first embodiment geophone system has a single-ended input. Current output $I_{GP}$ of the geophone device may not be measured at a single output terminal 12a but may instead output through differential output terminals 12b and 12c. Differential output terminals 12b and 12c may in turn each respectively couple in line with a resistor R' and a mux as shown in FIG. 1B. Output terminal 12b of geophone or other low-power output instrument or sensor 10 may be coupled in line to a resistor R', a mux, and the current-mode delta-sigma analog-to-digital converter 14b. Output terminal 12c of geophone or other low-power output instrument or sensor 10 may be coupled in line to another resistor R', another mux, and the current-mode delta-sigma analog-to-digital converter 14b. The current-mode delta-sigma analog-to-digital converter 14b may have either a current-mode or a charge-mode feedback. The values for the resistors R' may be selected in such a way so that the transducer or geophone sensor may be designed to experience constant or substantially constant (e.g., within measurable limits) low impedance, as practically possible. The advantage of differential operation may be generally lower noise for a given power and more immunity to common-mode noise.

Referring to FIG. 1B, the transducer or a geophone sensor, or other low-power output instrument or sensor is shown as element 10, outputting a variable current signal in response to vibrations or movement of the earth. Current output of the transducer or geophone sensor or other low-power output instrument or sensor 10 may be measured at output terminals 12b and 12c of the transducer, or geophone sensor, and/or other low-power output instrument or sensor 10, which may be a terminal present on a sensor packaging or wire leads from a sensor or the like. Current-mode delta-signal analog-to-digital converter 14b may measure the current output $I_{GP}$ produced by the geophone or other instrument and may then output a digital signal indicative of this current output. This digital signal, which may be representative of earth vibrations or movement, or other signal types, may then be communicated to a digital circuit 16b for data logging, analysis, alarm functions, or other uses commonly known for such transducer, geophone, or other sensor data.

Figure 2A:
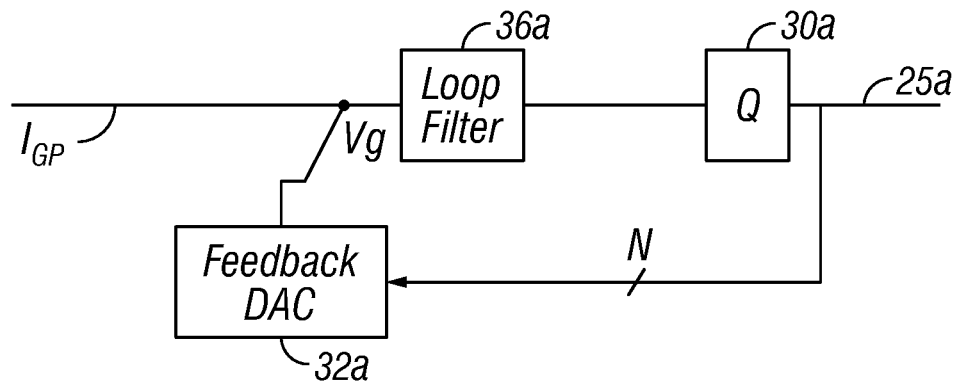
FIG. 2A is a circuit block diagram of an example embodiment of a low-power analog-to-digital converter having a single-ended input and a feedback digital-to-analog (DAC) path, in accordance with embodiments of the present disclosure.
Figure 2B:
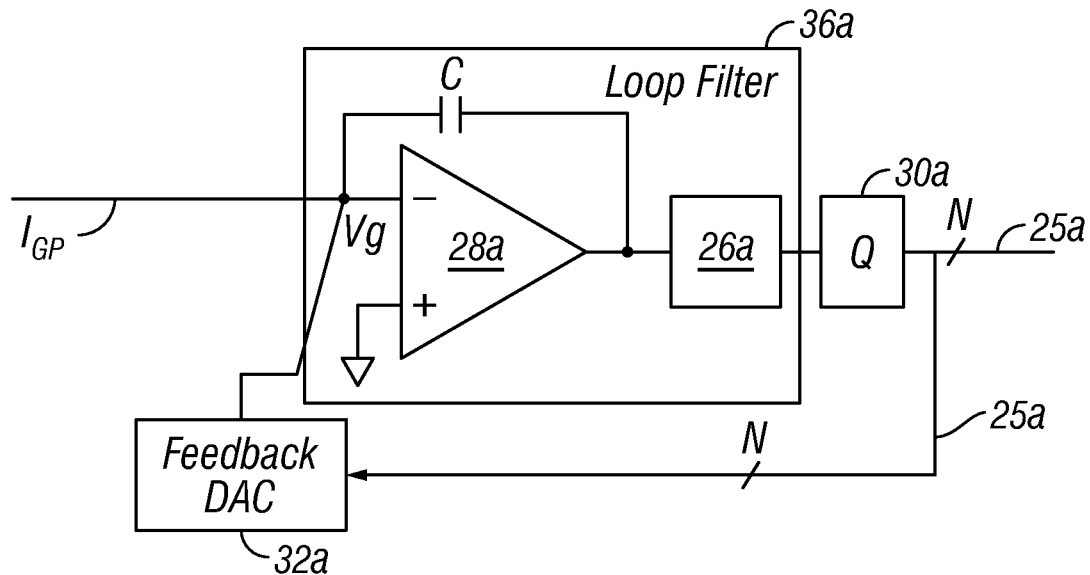
FIG. 2B is a circuit block diagram of the low-power analog-to-digital converter of FIG. 2A and provides more details for the loop filter, in accordance with embodiments of the present disclosure.
Figure 2C:
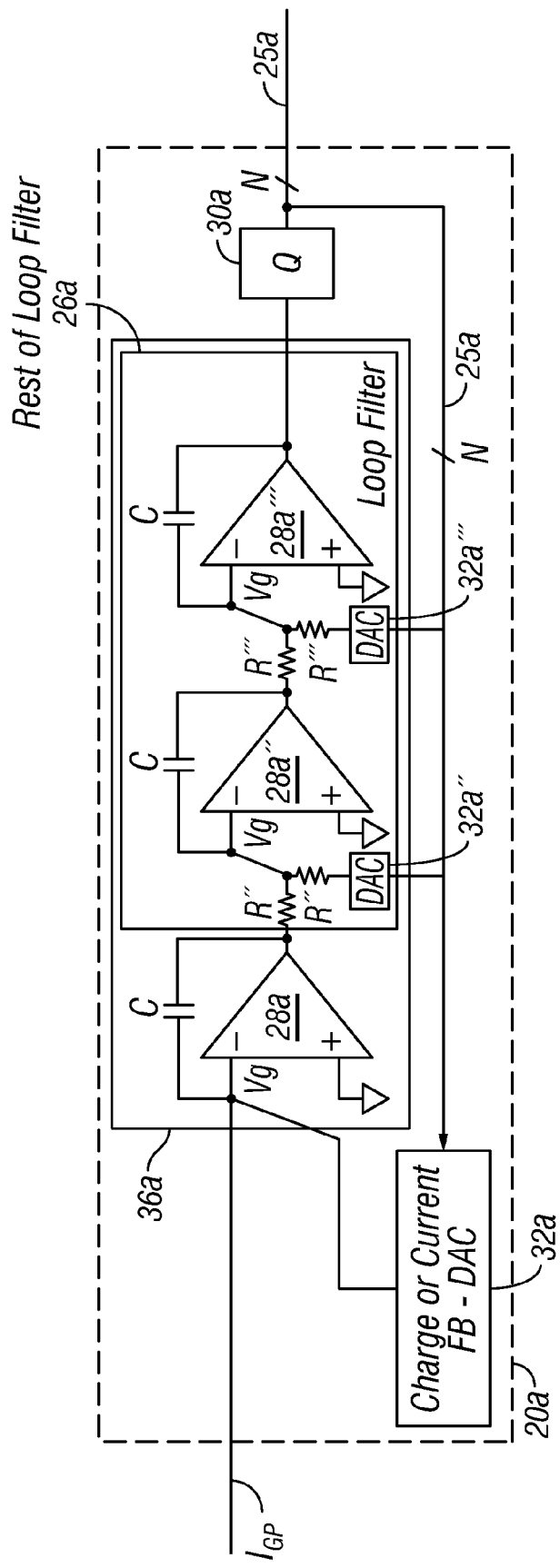
FIG. 2C is a circuit block diagram of the low-power analog-to-digital converter of FIG. 2B and provides more details for the rest-of-the-loop-filter, in accordance with embodiments of the present disclosure.

FIGS. 2A to 2C disclose circuit block diagrams that illustrate an example low-power analog-to-digital converter ("ADC") having a single-ended input, in accordance with the present disclosure. FIG. 2A shows the low-power ADC having a loop filter 36a, a quantizer (Q) 30a, and a feedback digital-to-analog converter (DAC) 32a. Current $I_{GP}$ from geophone sensor, or the transducer, or other low-power output instrument or sensor 10 may be provided directly as an input current to loop filter 36a. The input current directly from the transducer or sensor may be provided to a first stage or first integrator of the loop filter 36a, and such current into the first stage or first integrator may cause and generate the digital feedback signal that may be fed into feedback DAC 32a. The feedback path in the embodiment of FIG. 2A may be implemented as a charge-mode feedback path or a current-mode feedback path.

FIG. 2B is a circuit block diagram of the low-power analog-to-digital converter of FIG. 2A, and FIG. 2B provides more details for the loop filter 36a. Loop filter 36a may have a first stage with an operational amplifier integrator 28a, a capacitor C, and a rest-of-the-loop-filter 26a coupled in the manner and configuration shown in FIG. 2B in accordance with the embodiment(s) of the present disclosure. The negative input terminal of integrator 28a may receive the current $I_{GP}$ directly from the transducer or geophone sensor, and the positive input terminal of integrator 28a may be grounded.

FIG. 2C is a circuit block diagram of the low-power analog-to-digital converter of FIG. 2B, and FIG. 2C provides more details for the rest-of-the-loop-filter 26a. The rest-of-the-loop-filter 26a may have a second stage with an operational amplifier integrator 28a", another capacitor C, resistors R", and a feedback DAC 32a", and a third stage with an operational amplifier integrator 28a''', yet another capacitor C, resistors R''', and a feedback DAC 32a''', coupled in the manner and configuration as shown in FIG. 2C. In one example embodiment, the output of quantizer (Q) 30a may respectively be fed into the second and third stages via DACs 32a" and 32a''' as shown in FIG. 2C. In this example, the loop order is three or a third order. The design of loop filters and noise transfer functions is well understood by those skilled in the art. This topology is called a third-order feedback-type, and may have the advantage of high immunity to high-frequency noise.

A charge-mode feedback digital-to-analog converter 32a may make the geophone system less sensitive to jitter in clock output but may introduce a transient behavior into the virtual ground Vg. This jitter problem may be solved, such as taught and disclosed in U.S. Pat. No. 5,896,101 to Melanson, issued on Apr. 20, 1999, entitled "Wide Dynamic Range Delta Sigma A/D Converter" and incorporated herein by reference. For most purposes, charge-mode and current-mode may be used interchangably.

Figure 3:
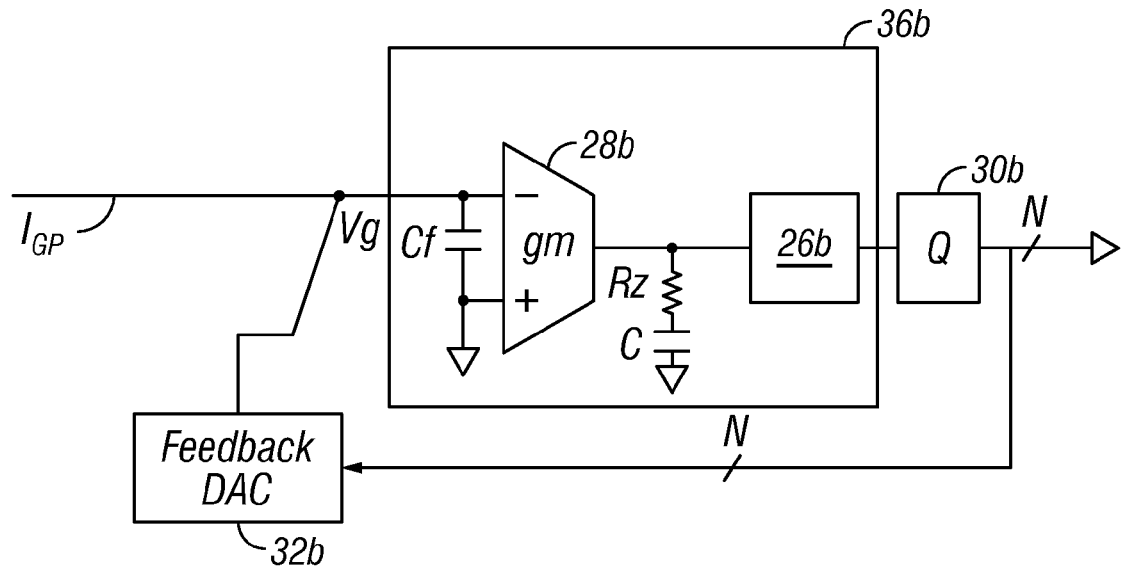
FIG. 3 is a circuit block diagram of a further example embodiment of a lower power analog-to-digital converter, in accordance with the present disclosure.

FIG. 3 shows a circuit block diagram of a further example embodiment of a low-power ADC, in accordance with the present disclosure. The low-power ADC in FIG. 3 may be similar to the low-power ADC in FIG. 2B. The low-power ADC in FIG. 3 may have a loop filter 36b, a quantizer (Q) 30b, and a feedback DAC 32b coupled in the manner shown in FIG. 3. Instead of a first operational amplifier integrator stage, loop filter 36b may have a first transconductance gain stage 28b. The first transconductance gain stage 28b may have a capacitor Cf coupled across its differential inputs. The negative differential input of the first transconductance gain stage 28b may receive the current input $I_{GP}$ from geophone sensor, or the transducer, or other such sensor. The positive differential input of the first transconductance gain stage 28b may be grounded. The first transconductance gain stage 28b may also have an RC network comprising a resistor Rz and a capacitor C coupled across its output. First transconductance gain stage 28b may be coupled to a rest-of-the-loop-filter 26b as shown in FIG. 3.

Figure 4:
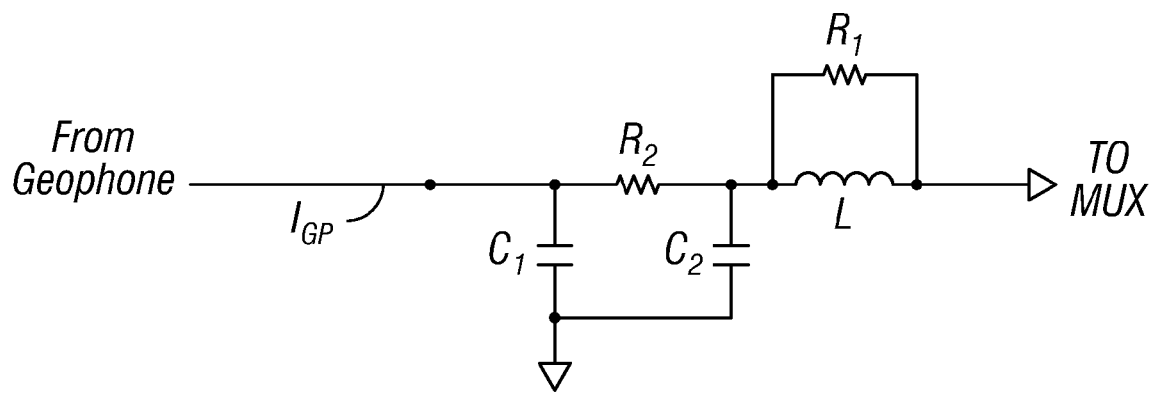
FIG. 4 is a circuit block diagram of an example isolation network that can be used between the geophone sensor and the first stage of the low-power analog-to-digital converter of the geophone system of FIGS. 1A, 1B, 6A, and/or 7, in accordance with embodiments of the present disclosure.

FIG. 4 shows an example optional isolation network that may be used between the transducer or geophone sensor or other such sensor and the first stage of the low-power ADC of the geophone system, such as the geophone system of FIG. 1A or 1B, in accordance with embodiments of the present disclosure. The example isolation network has resistors $R_1$ and $R_2$, capacitors $C_1$ and $C_2$, and inductor L coupled in the manner shown in FIG. 4. The example isolation network is optional and is not required. If used, the example isolation network could be coupled between the transducer or geophone sensor or other such sensor and the mux shown in FIG. 1A or 1B. The isolation network may allow the first integrator to operate at the lowest possible power without adding additional noise in the signal band.

Figure 5:
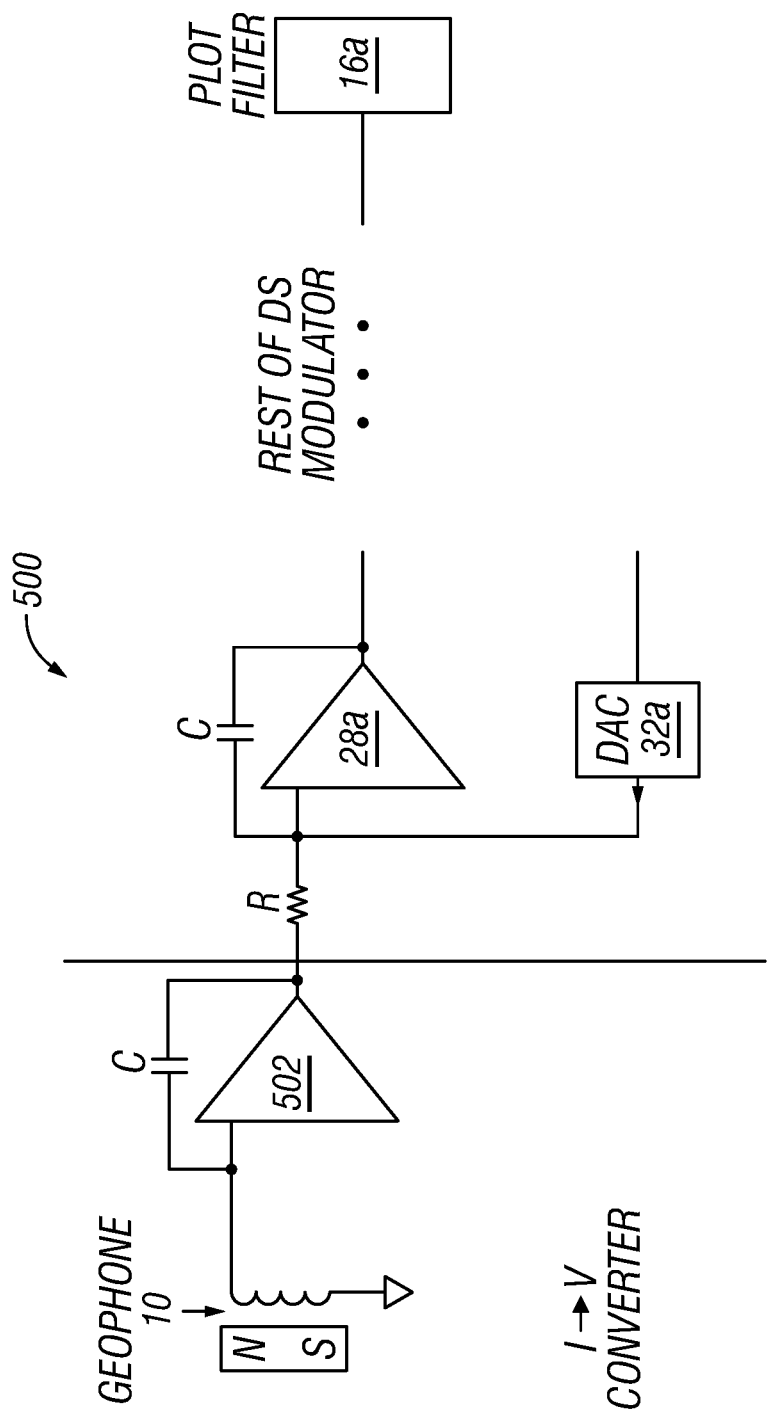
FIG. 5 is a circuit block diagram illustrating a front-end portion of a geophone system in accordance with the prior art.

FIG. 5 shows a circuit block diagram that illustrates a front end portion 500 of a geophone system in accordance with the prior art. Front end geophone system portion 500 shows a transducer or geophone sensor or other such sensor 10 coupled to a preamplifier 502. Preamplifier 502 has a capacitor C coupled across its input and output as shown in FIG. 5. The preamplifier 502 operates as a current-to-voltage converter (I-to-V converter) or a transimpedance amplifier for the geophone system of FIG. 5 to receive the geophone input signals. Preamplifier 502 is coupled to a first stage or first integrator 28a of the loop filter of the ADC, and the loop filter is in turn coupled to the rest of the loop filter or delta-sigma modulator. The output of the loop filter is coupled to the digital filter 16a. Operating current is required for both the preamplifier and the ADC, and both contribute noise to the output. Western Geco UniQ integrated point-receiver land seismic system and Japanese Patent No. P3098045 provide examples of such a preamplifier and ADC geophone system configuration.

All of the example embodiments of the geophone systems and low-power ADCs as provided in accordance with the present disclosure may eliminate having to use a preamplifier, I-to-V converter, and/or transimpedance amplifier between the transducer/sensor and the ADC.

Figure 6A:
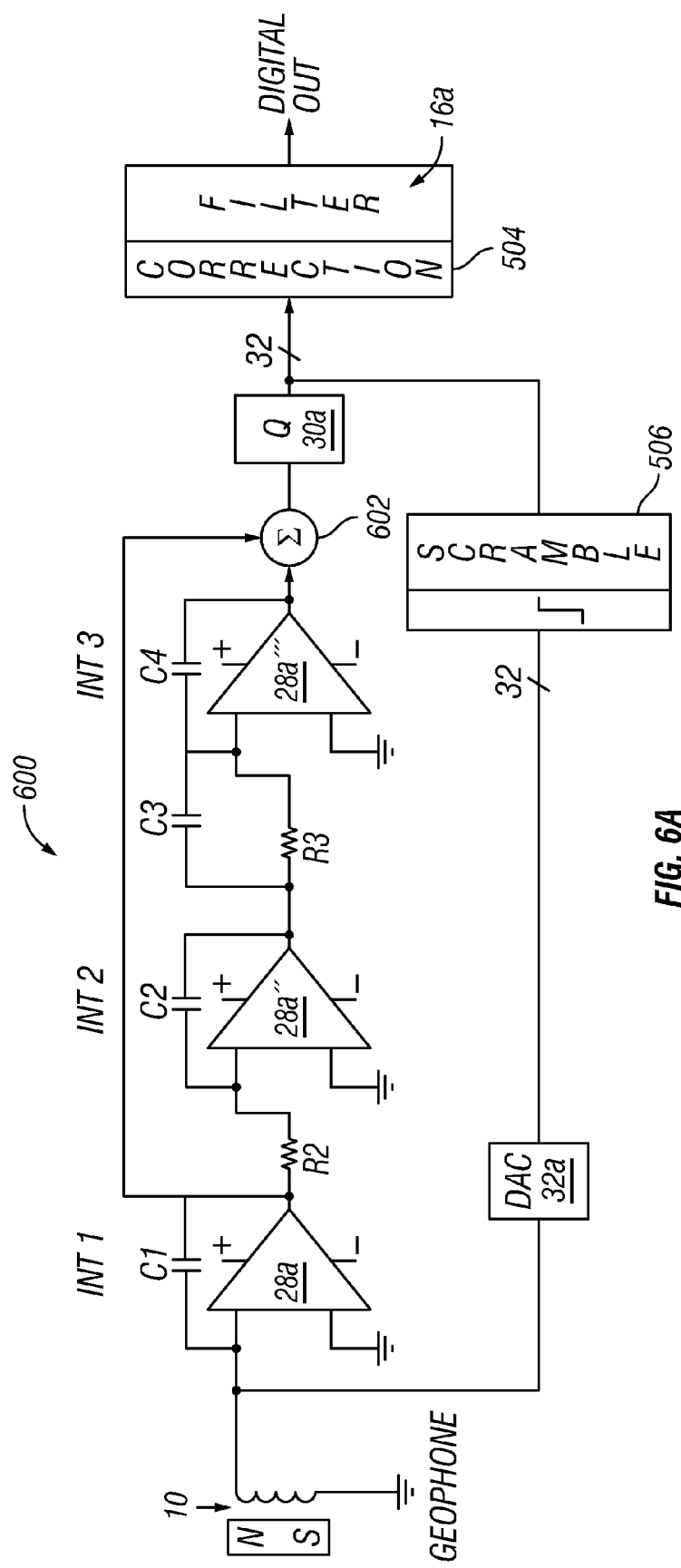
FIG. 6A is a circuit block diagram of an example embodiment geophone system having a low-power ADC that has a single-ended input and a feedforward path only, in accordance with embodiments of the present disclosure.

FIG. 6A shows a circuit block diagram of an example embodiment geophone system 600 having a low-power ADC that has a single-ended input and a feedforward path only, in accordance with embodiments of the present disclosure (e.g., single-ended, feedforward geophone system topology). In the example of FIG. 6A, the geophone sensor 10 may be referenced to ground, and the current output of the geophone sensor 10 may be fed directly as an input into the first stage or first integrator INT1 having an operational amplifier integrator 28a and a capacitor C1 coupled in the manner shown in FIG. 6A. The first stage or first integrator INT1 may be coupled in series with second and third stages/integrators INT2 and INT3 in the manner shown in FIG. 6A. Second stage/integrator INT2 may have an operational amplifier integrator 28a", a resistor R2, and a capacitor C2 coupled in the manner shown in FIG. 6A, while the third stage/integrator INT3 may have an operational amplifier integrator 28a''', resistor R3, and capacitors C3 and C4 coupled in the manner shown in FIG. 6A. The outputs of first stage/integrator INT1 and the third stage/integrator INT3 may be fed into a summer 602 as shown in FIG. 6A. The output of the summer 602 may be fed into quantizer (Q) 30a. The significant advantage of this topology may be the reduction of noise and power by the joining of the amplifier with the ADC. The key characteristic of the circuit may be the balancing of the geophone current with the current DAC feedback current, and the delta-sigma conversion ensuring that balance.

The output of quantizer (Q) 30a may be provided as an output to a correction block 504 and a digital filter 16a and also fed back to a scramble block 506 and feedback DAC 32a as shown in FIG. 6A. Example correction, calibration, and/or compensation operations, techniques, and/or methods for the correction block 504 are disclosed in U.S. Pat. No. 6,449,569 to Melanson (hereafter "the '569 patent") entitled "CALIBRATION AND COMPENSATION OF DELTA SIGMA ADC'S AND DAC'S BY CORRELATING NOISE SIGNALS," and incorporated by reference herein. Furthermore, example scramble operations, techniques, and/or methods for the scramble block 506 are disclosed in U.S. Provisional Application No. 62/020,706 entitled "Element Scrambling for Compensation/Calibration of Analog-to-Digital Converter ("ADC") Feedback Elements" filed on Jul. 3, 2014 and in U.S. application Ser. No. 14/617,376 entitled "Systems and Methods of Elements Scrambling for Compensation and Calibration of Analog-to-Digital Converter Feedback" filed on Feb. 9, 2015 (hereafter "Scramble Applications"), and the Scramble Applications are hereby incorporated by reference. Thus, scramble block 506 may scramble selection of digital-to-analog elements of the feedback digital-to-analog converter (e.g., selection of individual switched current supplies of FIG. 6B, selection of resistor DAC elements of FIG. 7).

As shown in the example geophone system 600, only one feedback path from the output of the quantizer (Q) 30a to the input of the first stage/integrator 28a may exist in this embodiment. Thus, the low-power ADC in geophone system 600 may be a feedforward design for the low-power ADC. In such a feedforward design, an input from each of the stages/integrators would often be fed to the summer 602. In the example embodiment of geophone system 600, one of the input paths to the summer 602 may be replaced by the function of capacitor C3.

Figure 6B:
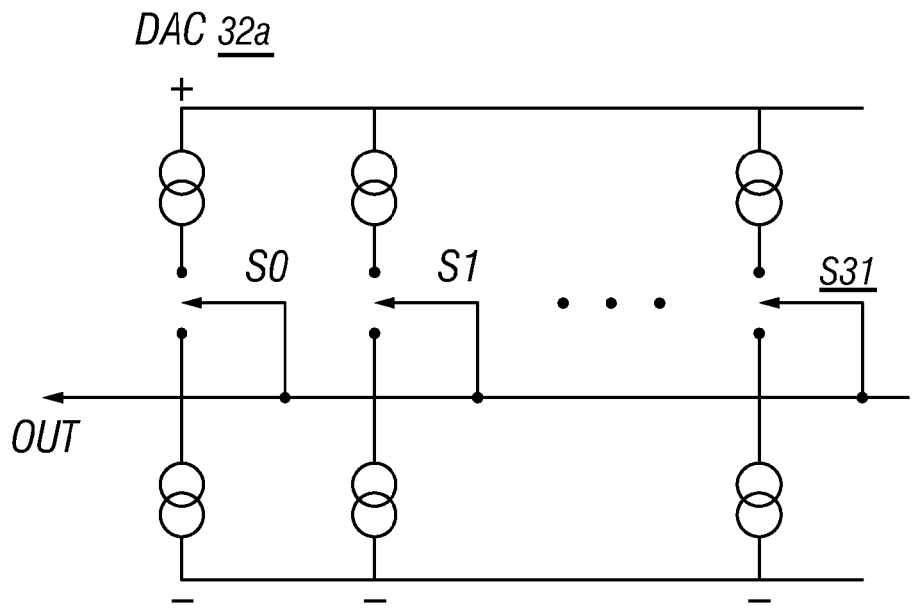
FIG. 6B is a circuit block diagram of an example embodiment feedback DAC that can be used as the feedback DAC in the example geophone system of FIG. 6A.
Figure 6C:
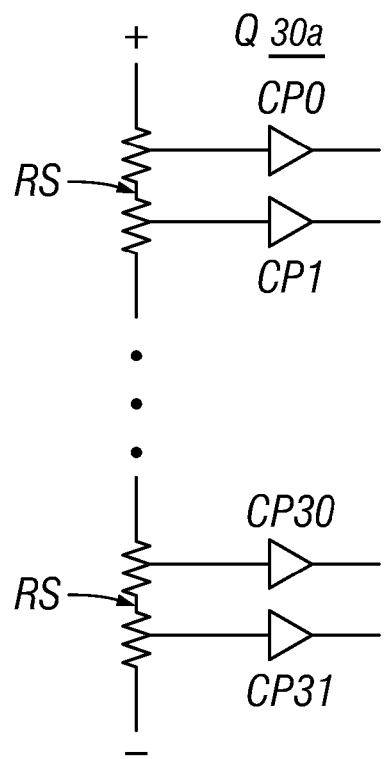
FIG. 6C shows a circuit block diagram of an example embodiment quantizer that can be used as the quantizer in the example geophone system of FIG. 6A.

FIG. 6B shows a circuit block diagram of an example embodiment feedback DAC that may be used as the feedback DAC 32a in the example geophone system 600. Example feedback DAC 32a may comprise a number of current sources S0, S1, S2 . . . S31, and the current sources may generally be configured as shown in FIG. 6B. Each current source may comprise a field-effect transistor (FET) current minor, or similar system. FIG. 6C shows a circuit block diagram of an example embodiment quantizer (Q) that may be used as the quantizer (Q) 30a in the example geophone system 600. Example quantizer (Q) 30a may comprise a voltage reference string(s) RS and thirty-two (32) comparators CP0, CP1, . . . , CP30, CP31 coupled in the manner shown in FIG. 6C. The number of current sources, and quantization levels, is a design choice, with four to sixty-four (4-64) levels being typical for a high performance system.

Geophone system 600 may operate in a current mode and may have a feedback loop that cancels the geophone input current with the current of the feedback DAC 32a. Geophone system 600 may eliminate the need to have a preamplifier, I-to-V converter, and/or transimpedance amplifier between the geophone sensor/transducer and the low-power ADC. Geophone system 600 is only one example of many examples and topologies that can implement such a scheme or system.

Figure 7:
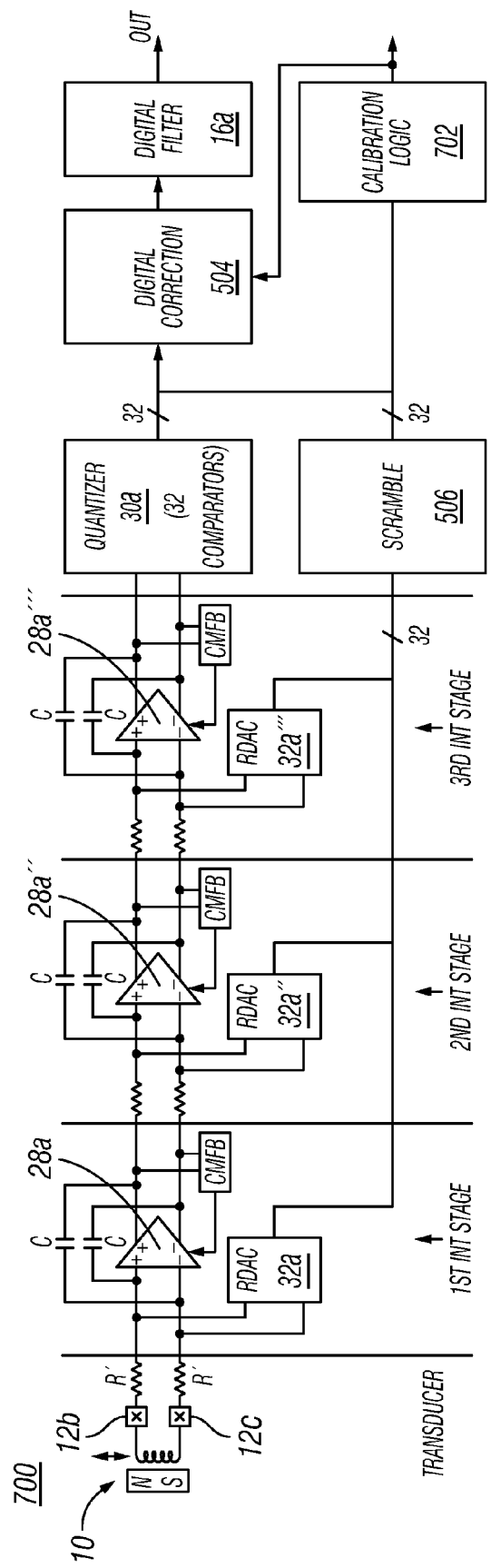
FIG. 7 is a circuit block diagram of an example embodiment of a third-order geophone system with differential-ended inputs wherein the third-order geophone system has a low-power ADC that has differential-ended inputs and feedback DACs, in accordance with embodiments of the present disclosure.

FIG. 7 shows a circuit block diagram of an example embodiment of a third-order geophone system 700 with differential-ended inputs. The third-order geophone system 700 may have a low-power ADC that has differential-ended inputs and feedback DACs, in accordance with embodiments of the present disclosure. The topology shown in FIG. 7 is often referred to as a feedback topology. The topology may have a low-pass signal transfer function (STF). The third-order noise-to-transfer function (NTF) may be set by the choice of resistors and capacitors. In the example embodiment, resistor DACs (RDACs) 32a, 32a", and 32a'" may be used and may provide the feedback DACs for respective first, second, and third integrator stages. One RDAC may be provided and used for each stage. The choice of order, topology, and NTF is a well-understood design space trade-off.

A thirty-two (32) level feedback is shown in the example geophone system 700 depicted in FIG. 7. Such a choice to use a 32-level feedback is also understood to be a design trade-off of space and accuracy. Example geophone system 700 may be fully differential which may provide good external noise rejection. Geophone sensor 10 may be coupled to differential inputs 12b and 12c and respective in-line resistors R' to a loop filter as shown in FIG. 7. The loop filter may include first, second, and third integrator stages ($1^{st}$ INT STAGE, $2^{ND}$ INT STAGE, $3^{RD}$ INT STAGE) as shown in example geophone system 700. The loop filter may have differential outputs that feed into example quantizer 30a. Quantizer 30a comprises thirty-two (32) comparators that provide thirty-two (32) outputs to a digital filter 16a. Correction for the digital output signals from quantizer 30a being fed into the digital filter 16a may be provided by a digital correction block 504. Thus, digital correction block 504 may be coupled between quantizer 30a and digital filter 16a. Furthermore, calibration of the digital signals into digital filter 16a may be accomplished through a calibration logic block 702 and a scramble block 506 that are coupled in the manner shown in example geophone system 700. As referenced before, the '569 patent and the Scramble Applications provide respective example calibration and scramble operations, techniques, and/or methods for the corresponding calibration logic block 702 and the scramble block 506. The calibration logic block 702 may be used to linearize the geophone system 700 by determining the ratios of DAC resistors, the values of which are used in the digital filter 16a. A dynamic-element-matching (DEM) block can be used in place of the scramble block 506. Such a DEM block may remove the need for the calibration logic block 702 but, on the other hand, may increase susceptibility to intersymbol interference (ISI). The output of quantizer 30a may be fed back to the first, second, and third integrator stages through respective feedback resistor DACs 32a, 32a", and 32a'" as shown in example geophone 700.

Figure 8:
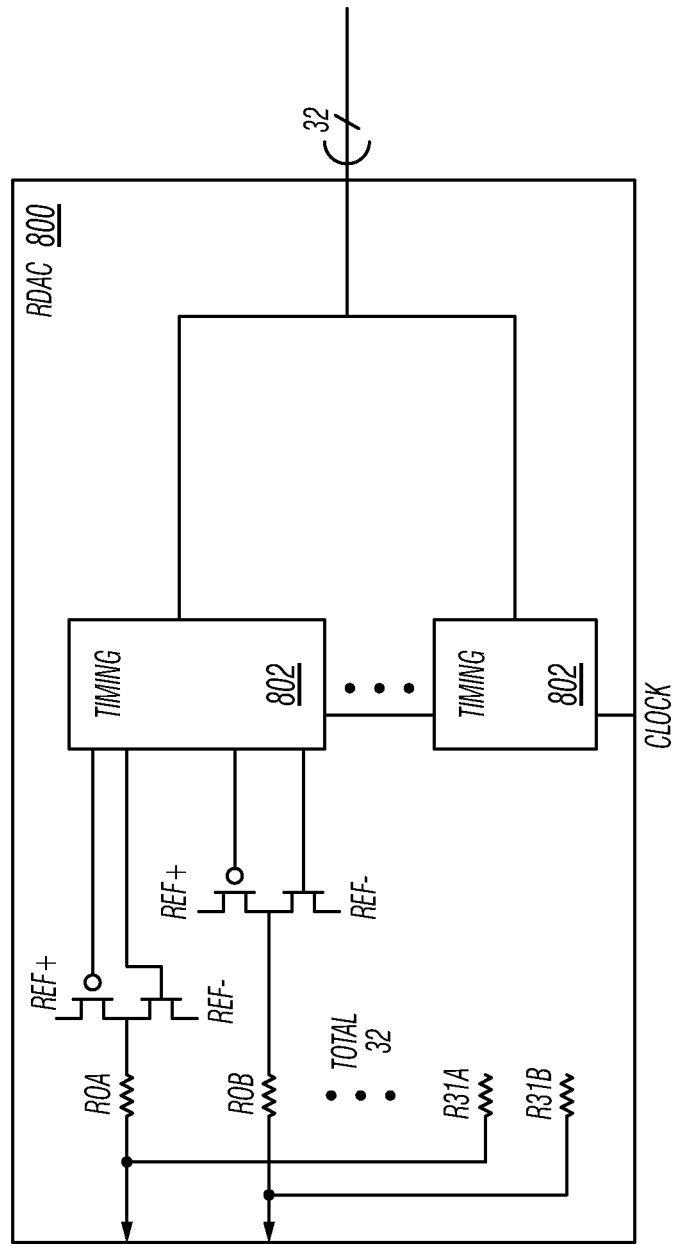
FIG. 8 is a circuit block diagram of an example resistor feedback DAC that can be used as the feedback DAC(s) in the geophone sensor system of FIG. 7.

FIG. 8 shows an example resistor feedback DAC (RDAC) 800 that may be used as the feedback resistor DAC 32a, 32a", and/or 32a'" in the example geophone system 700. In the embodiment depicted in FIG. 8, RDAC 800 comprises thirty-two (32) pairs of resistors R0A, R0B; R1A, R1B, . . . R30A, R30B; R31A, R31B. One of the resistors in each resistor pair may be coupled to a positive voltage reference +VREF of a transistor/switch pair and the other resistor in each resistor pair may be coupled to a negative voltage reference −VREF of the transistor pair. Such a construction for RDAC 800 may provide thirty-three (33) levels of feedback (e.g., 0-32 levels), when each resistor unit is considered a nearly identical element to each other. The timing block(s) 802 may utilize and/or provide a clock (CLOCK) that synchronizes the change of transistor switches for the transistor/switch pair(s) and may minimize the shoot-through current by non-overlapping the transistors of the transistor/switch pair. Thus, geophone system 700 may operate in a way so that direct feedback of current is provided by the first stage or first integrator of RDAC 32a to the signal input nodes 12b and 12c. The choice of the digital input sets the position of the switches, and therefore the feedback current.

The example embodiment of the low-power ADC having the single-ended input in FIGS. 2A to 2C can be used as a specific example implementation for CM ΔΣ ADC 14a in the geophone system shown in FIG. 1A. Similarly, the low-power ADC having differential-ended inputs in FIG. 5 may be used as a specific implementation for CM ΔΣ ADC 14b in the geophone system shown in FIG. 1B.

Different example embodiments and example implementations of a low-power ADC have been discussed and disclosed in the present disclosure. The low-power ADC in accordance with the present disclosure is configured to couple or connect to a transducer, geophone sensor, or other such sensor. The low-power ADC may digitize the output of the transducer, geophone sensor, or other such sensor. The transducer, geophone sensor, or other such sensor may have an output that is generally representative of mechanical motion.

The geophone sensor system in accordance with the present invention, such as the example ones disclosed and discussed in FIGS. 1A, 1B, 2C, 3, 6A, and 7, describe a system in which the transducer, geophone sensor, or other such sensor (e.g., transducer/sensor input) is driven into as low as possible/practical of an impedance. For example, as previously discussed, the values for the in-line resistors R and R' shown in respective FIGS. 1A, 1B, and 7 may be selected in a manner such that their input resistances are intentionally kept as low as possible. However, these resistor values are limited by the stability and practical mux impedance. These resistor values may be selected so that the input of the geophone sensor system is designed to have a low impedance. Typical values of such resistors R or R' are ten (10) ohms to one hundred (100) ohms. By providing such low input impedance to the geophone sensor system, the transducer or geophone sensor or other such sensor may be able to be operated directly in current mode.

By the geophone sensor system operating directly with the transducer or geophone sensor or other such sensor, no additional resistive noise is added to the geophone sensor system. The low impedance dampens the motion of the transducer/sensor coil which improves linearity. The concept of low-impedance has existed. For example, a geophone followed by a current-to-voltage converter (I-to-V converter/pre-amplifier) and further followed by an ADC has existed as a solution. However, a geophone sensor system directly receiving the input transducer/sensor current into a low impedance node and balancing the low impedance node with current output feedback DAC is a solution currently disclosed in accordance with the present disclosure. This currently disclosed solution dramatically increases the performance for a given operating power, as the converter/preamplifier and ADC are integrated and the conversion of the geophone signals is direct.

The present disclosure is not in any way limited to the topologies or configurations of the geophone sensor system or the low-power ADCs specifically provided in this present disclosure. For example, the geophone sensor system and the low-power ADCs are not in any way limited to a respective or corresponding feedforward topology, feedback topology, a single-ended topology, and/or a differential-ended topology.

Further embodiments likewise, with the benefit of this disclosure, will be apparent to those having ordinary skill in the art, and such embodiments should be deemed as being encompassed herein. While certain embodiments have been disclosed and described in detail herein, it may be apparent to those having ordinary skill in the art that various changes in form and detail may be made therein without departing from the spirit and scope of this disclosure.

What is claimed is:

1. A low power analog-to-digital converter configured to sense sensor signals, comprising:
   a loop filter having a loop filter input configured to receive an input current signal from a sensor and generate an output signal responsive to the input current signal; and
   a feedback digital-to-analog converter having a feedback output configured generate one of a current-mode feedback output signal or a charge-mode feedback output signal responsive to the output signal, the feedback output coupled to the loop filter input in order to combine the input current signal and the feedback output signal at the loop filter input.

2. The analog-to-digital converter of claim 1, wherein the sensor comprises a geophone, outputting a low power signal.

3. The analog-to-digital converter of claim 1, wherein the output signal is a digital signal.

4. The analog-to-digital converter of claim 1, wherein the loop filter comprises a delta-sigma converter configured to convert the input current signal into the output signal.

5. The analog-to-digital converter of claim 1, wherein the loop filter comprises an integrator including an amplifier having an input comprising the loop filter input and having a feedback capacitor coupled between the input of the amplifier and an output of the amplifier, the integrator configured to provide a virtual ground at the loop filter input.

6. The analog-to-digital converter of claim 1, wherein the loop filter comprises a transconductance gain stage having differential inputs including a first input comprising the loop filter input, and wherein the transconductance gain stage comprises a capacitor coupled across the differential inputs.

7. The analog-to-digital converter of claim 1, wherein the feedback digital-to-analog converter comprises a plurality of switched current sources.

8. The analog-to-digital converter of claim 1, wherein the feedback digital-to-analog converter comprises a resistor digital-to-analog converter.

9. The analog-to-digital converter of claim 1, further comprising a scramble block for scrambling selection of digital-to-analog elements of the feedback digital-to-analog converter.

10. The analog-to-digital converter of claim 1, further comprising calibration logic for linearizing the analog-to-digital converter.

11. The analog-to-digital converter of claim 10, wherein the calibration logic linearizes the analog-to-digital converter by determining ratios of resistors of the feedback analog-to-digital converter and the analog-to-digital converter further comprises a digital filter for filtering the output signal based on the ratios.

12. A method for sensing sensor signals, comprising:
   receiving an input current signal from a sensor in a loop filter having a loop filter input;
   generating an output signal responsive to the input current signal by the loop filter;
   generating one of a current-mode feedback output signal or a charge-mode feedback output signal responsive to the output signal; and
   combining the input current signal and the feedback output signal at the loop filter input.

13. The method of claim 12, wherein the sensor comprises a geophone, outputting a low power signal.

14. The method of claim 12, wherein the output signal is a digital signal.

15. The method of claim 12, wherein the loop filter comprises a delta-sigma converter configured to convert the input current signal into the output signal.

16. The method of claim 12, wherein the loop filter comprises an integrator including an amplifier having an input comprising the loop filter input and having a feedback capacitor coupled between the input of the amplifier and an output of the amplifier, the integrator configured to provide a virtual ground at the loop filter input.

17. The method of claim 12, wherein the loop filter comprises a transconductance gain stage having differential inputs including a first input comprising the loop filter input, and wherein the transconductance gain stage comprises a capacitor coupled across the differential inputs.

18. The method of claim 12, wherein the feedback digital-to-analog converter comprises a plurality of switched current sources.

19. The method of claim 12, wherein the feedback digital-to-analog converter comprises a resistor digital-to-analog converter.

20. The method of claim 12, further comprising scrambling selection of digital-to-analog elements of the feedback digital-to-analog converter with a scramble block for.

21. The method of claim 12, further comprising linearizing the output signal with calibration logic.

22. The method of claim 21, wherein the calibration logic linearizes the analog-to-digital converter by determining ratios of resistors of the feedback analog-to-digital converter and the method further comprises a filtering the output signal based on the ratios.

* * * * *